United States Patent
Yoshihara et al.

[19]

[11] Patent Number: 5,677,611

[45] Date of Patent: Oct. 14, 1997

[54] CONTROL APPARATUS FOR AN ELECTRIC VEHICLE

[75] Inventors: Shigeyuki Yoshihara; Hiroshi Katada, both of Hitachinaka, Japan

[73] Assignees: Hitachi, Ltd., Tokyo; Hitachi Car Engineering Co., Ltd., Ibaraki, both of Japan

[21] Appl. No.: 673,121

[22] Filed: Jul. 1, 1996

[30] Foreign Application Priority Data

Jul. 3, 1995 [JP] Japan .................................. 7-167417

[51] Int. Cl.[6] ...................................................... B60L 3/00
[52] U.S. Cl. ........................... 318/803; 318/139; 318/812
[58] Field of Search ..................................... 318/138, 139, 318/800–836, 474, 490, 432, 727, 798, 799; 187/293, 118, 29 R, 115, 116–119; 361/94, 87, 28, 32, 31, 30, 29

[56] References Cited

U.S. PATENT DOCUMENTS

| 4,590,413 | 5/1986 | Gritter et al. | 318/80 |
| 4,965,504 | 10/1990 | Ueda et al. | 318/802 |
| 5,066,899 | 11/1991 | Nashiki | 318/807 |
| 5,357,181 | 10/1994 | Mutoh et al. | 318/139 |
| 5,389,749 | 2/1995 | Hokai et al. | 187/293 |
| 5,592,355 | 1/1997 | Ikkai et al. | 361/94 |

FOREIGN PATENT DOCUMENTS 4-45078  2/1992  Japan .

*Primary Examiner*—Paul Ip
*Attorney, Agent, or Firm*—Antonelli, Terry, Stout & Kraus, LLP

[57] ABSTRACT

A control apparatus for an electric vehicle has an inverter for feeding currents to a three-phase AC motor corresponding to applied PWM signals, three current sensors, each of the sensors detecting a current of a respective phase in the three-phase AC motor, a revolution speed detector for detecting the speed of the three-phase AC motor, a motor control unit for controlling the three-phase AC motor which includes a current demand generating unit, a current control unit for performing feedback control based on the current demands and currents detected by the current sensors, and a PWM signal generating unit. To detect anomalies in the current sensors or the motor control circuit, there is also provided an anomaly detection unit for detecting an anomaly in the detected currents by checking whether monitoring index obtained by processing three values of the detected currents exceeds a preset threshold level and for outputting a current anomaly indicating signal, and an anomaly specifying unit for inputting diagnostic currents to the three-phase AC motor by judging the current anomaly indicating signal and identifying an anomalous current sensor among the three current sensors based on detection results of the diagnostic currents detected by the three current sensors. The control apparatus executes a motor control corresponding to one of a presence and a non-presence of an anomaly in the three current sensors.

7 Claims, 10 Drawing Sheets

CONTROL APPARATUS FOR AN ELECTRIC VEHICLE

BACKGROUND OF THE INVENTION

The present invention relates to a control apparatus for an electric vehicle, and more particularly to an electric automobile in which high operational reliability is required.

As mentioned in JP-A-45078/1992, a method of detecting an anomalous current sensor among three sensors for detecting currents input to a motor is applied to an existing electric vehicle.

In the above method, an anomalous current sensor is detected by checking whether any one of the three current sensors indicates a zero level during a predetermined period. However, since the checking of the outputs of the current sensors is carried out during operation of the motor current control unit, the presence of an anomalous current sensor can not be detected if the motor current control unit is anomalous.

SUMMARY OF THE INVENTION

An object of the present invention is to provide a control apparatus for an electric vehicle in which high operational reliability is realized by identifying the presence of an anomalous current sensor and by executing an adequate control method corresponding to the anomaly in the identified current sensor.

The above-mentioned objective is attained by providing a control apparatus for an electric vehicle having an inverter for feeding currents to a three-phase AC motor corresponding to applied PWM signals, three current sensors, each of the sensors detecting a current of a respective phase in the three-phase AC motor, a revolution speed detector for detecting the speed of the three-phase AC motor, and a motor control unit for controlling the three-phase AC motor including a current demand generating unit for generating current demands based on a revolution speed detected by the revolution speed detector, a current control unit for performing a feedback control based on the current demands and currents detected by the current sensors, and a PWM signal generating unit for generating the PWM signals, the control apparatus comprising:

anomaly detection means for detecting an anomaly in the detected currents of the three current sensors by checking whether a monitoring index, obtained by processing the three values of the detected currents, exceeds a preset threshold level, and for outputting a current anomaly indicating signal, if an anomaly is detected; and anomaly diagnosis means for outputting diagnostic currents to the three-phase AC motor in response to the current anomaly indicating signal and for identifying an anomalous current sensor among the three current sensors, based on detection results of the diagnostic currents detected by the three current sensors;

wherein a motor control depending on the detected presence or non-presence of an anomaly in the three current sensors is executed.

That is, in accordance with the present invention, if an anomaly in one of the current sensors is detected, the means for inputting diagnostic currents to the three-phase AC motor, which is provided separately from the motor control unit operating as a main control means, sends the diagnostic currents to the three-phase AC motor and identifies whether the anomaly in the detected currents is caused by the current sensors or a unit other than the current sensors. Since the motor control unit can continue to operate by using the remaining normal current sensors, or the anomaly diagnosis means can take over the motor control, a highly reliable motor control can be realized for an electric vehicle.

DETAILED DESCRIPTION OF THE EMBODIMENTS

Figure 1:
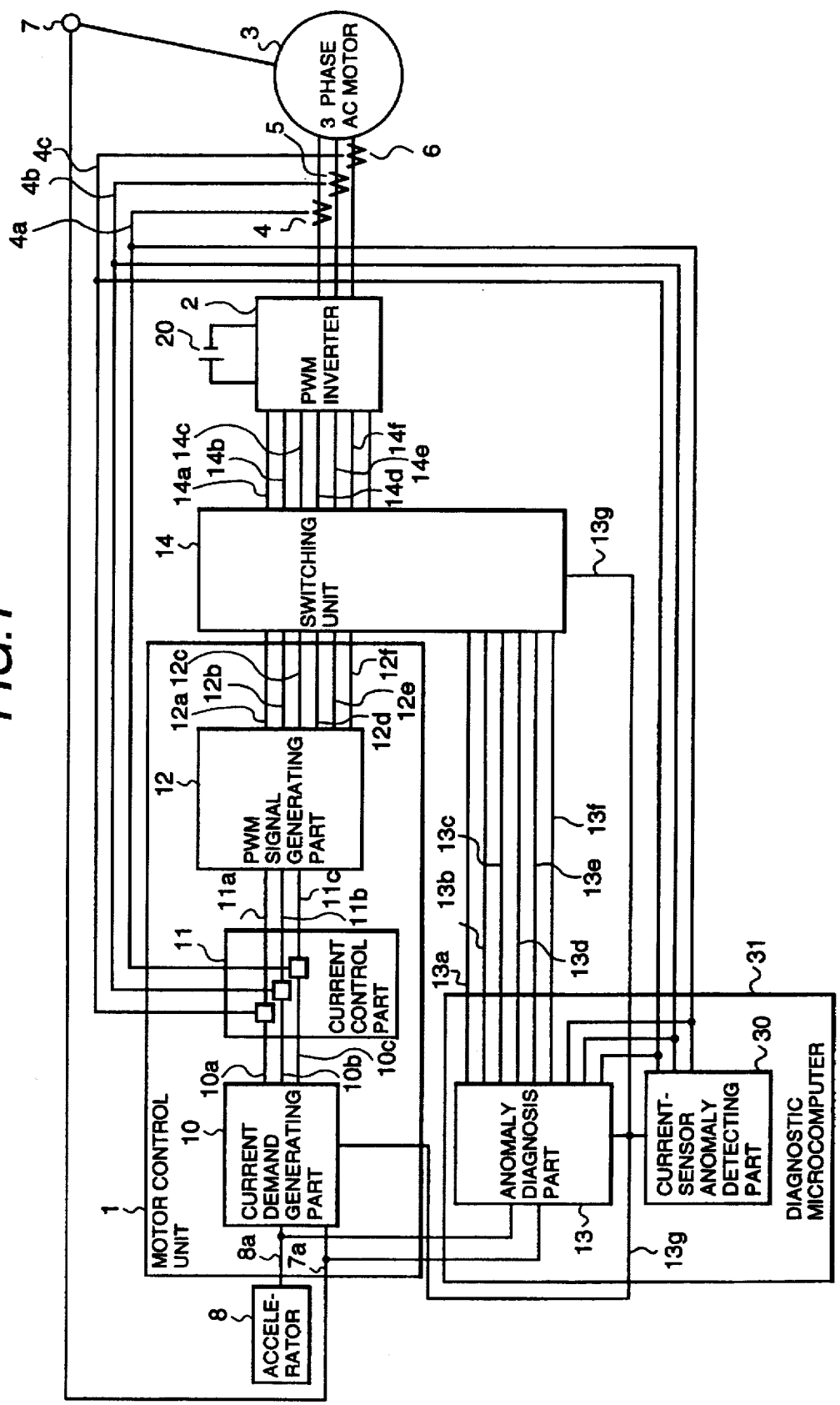
FIG. 1 is a schematic block diagram of a control apparatus for an electric vehicle forming an embodiment of the present invention.

Hereinafter, details of the present invention will be explained with reference to various embodiments shown in the drawings.

FIG. 1 shows the composition of a control apparatus for an electric vehicle forming an embodiment of the present invention.

A control apparatus for an electric vehicle, as seen in the figure, is composed of a motor control unit 2 for controlling a three-phase AC motor 3, a PWM inverter 2 for feeding currents to the three-phase AC motor ( hereafter simply referred to as the motor ), three current sensors 4, 5 and 6, each of the sensors detecting a current of a respective phase of the current flowing in the motor 3, a revolution speed sensor 7 for detecting the revolution speed of the motor 3, and diagnostic microcomputer 31 including sensor anomaly detection means and anomaly identification means. Numerals 8 and 20 indicate an accelerator and a battery, of the electric vehicle respectively.

The motor control unit includes a microcomputer, and is composed of a current demand generating part 10, a current control part 11 and a PWM signal generating part 12. The diagnostic microcomputer 31 includes a sensor anomaly detection part 30 and an anomaly diagnosis part 13 having the function of taking over the operations of the current demand generating part, the current control part and the PWM signal generating part. The switching unit 14 selects one of a PWM signal output from the PWM signal generating part 12 corresponding to an output signal of the current control part 11 and a PWM signal output from the anomaly diagnosis part 13. Thus, in the embodiment, the motor control continues to operate by using the anomaly diagnosis part 13 and the switching unit 14 upon occurrence of an anomaly in the motor control unit or in one of the current sensors.

The current demand generating unit 10 takes in an accelerator opening signal 8a and a detected revolution speed signal 7a, and outputs current demands 10a, 10b and 10c to the current control part 11. Further, a current sensor anomaly indicating signal 13g output from the anomaly diagnosis part 13 is also input to the current demand generating part 10. The current control part 11 receives the three current demands, and outputs voltage demands 11a, 11b and 11c to the PWM signal generating unit 12. The PWM signal generating part 12 outputs PWM signals for three phases 12a, 12b, 12c, 12d, 12e and 12f to the PWM inverter 2 via the switching unit 14.

Further, the anomaly diagnosis part 13 in the diagnostic microcomputer 31 outputs diagnostic PWM signals 13a, 13b, 13c, 13d, 13e and 13f to feed diagnostic currents to the motor 13. And, the anomaly diagnosis part 13, operating as an alternative motor control means, has a function equal to the function of the current demand generating part 10, the current control part 11 and the PWM signal generating part 12. Thus, the anomaly diagnosis part 13 takes in the accelerator opening signal 8a, the detected revolution speed signal 7a, and the detected currents 4a, 4b and 4c, and outputs the PWM signals 33a, 33b, 33c, 33d, 33e and 33f to control the motor 3. The current sensor anomaly detection part 30 executes an anomaly detection for the three current sensors, and outputs "0" if no anomaly is detected, otherwise it outputs "1".

Figure 2:
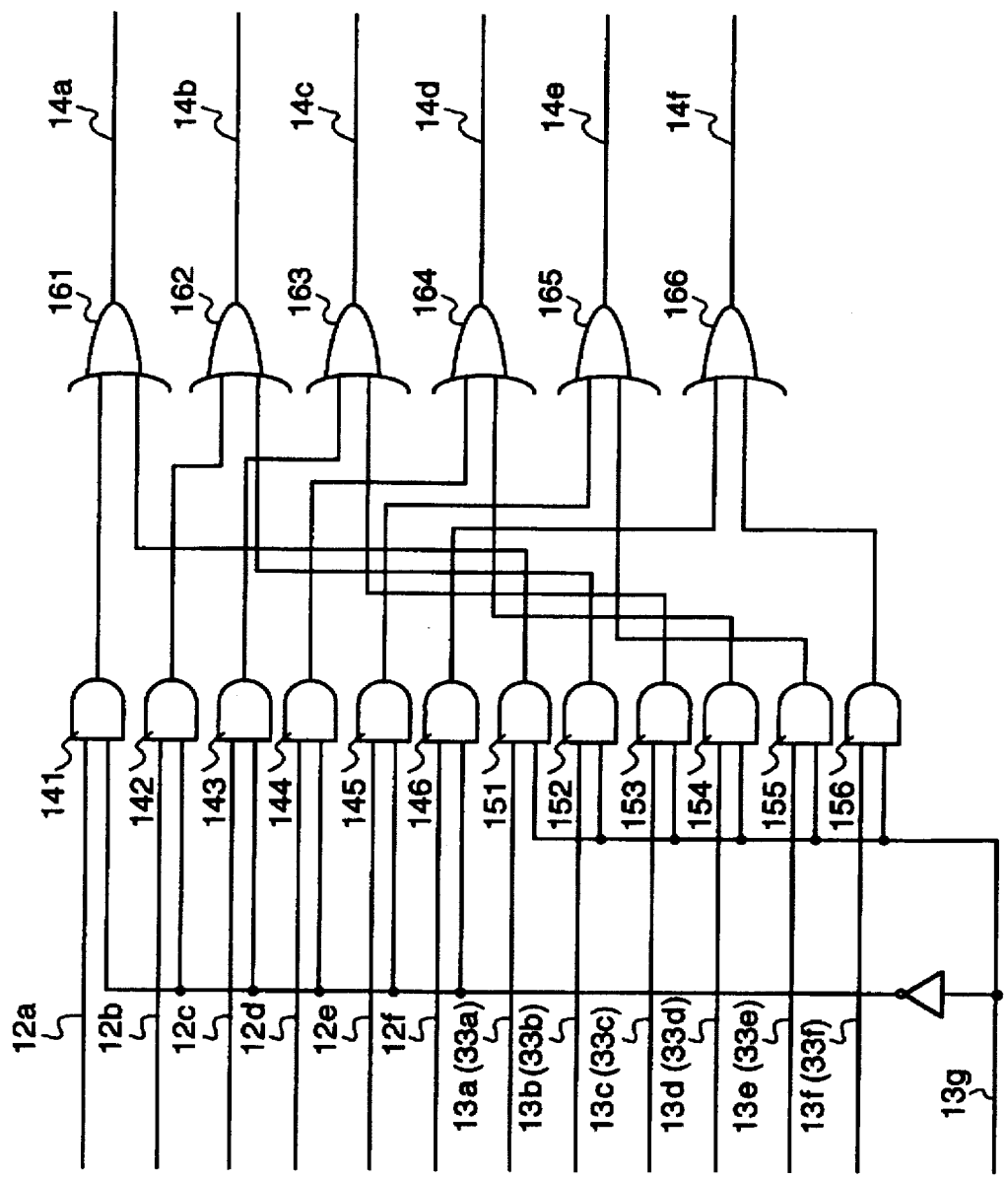
FIG. 2 is a schematic circuit diagram of an example of a switching unit shown in FIG. 1.

FIG. 2 is an example of the switching unit shown in FIG. 1. By reference to the figure, operations of the switching unit 14 will be explained in the following. Each of the PWM signals 12a–12f is input to an input terminal in a respective one of AND gate circuits 141–146, and an inverted signal of the current sensor anomaly indicating signal 13g is input to another input terminal in each of the AND gate circuits 141–146. Furthermore, Each of the diagnostic PWM signals 13a–13f is input to an input terminal in a respective one of AND gate circuits 151–156, and the current sensor anomaly indicating signal 13g is input to another input terminal in each of the AND gate circuits 151–156. And, outputs of the AND gate circuits 141–146 and outputs of the AND gate circuits 151–156 are input to OR gate circuits 161–166, and the final PWM signals 14a, 14b, 14c, 14d, 14e and 14f are output from the OR gate circuits. Thus, if the current sensor anomaly indicating signal 13g is "0" indicating "normal", the final PWM signals 14a –14f are the PWM signals 12a–12f, otherwise the final PWM signals 14a–14f are the PWM signals 13a–13f ( or the alternative PWM signals 33a–33f). That is, one signal group of the PWM signals and the diagnostic PWM signals are selected, depending on the value of the current sensor anomaly indicating signal 13g.

Then, the final PWM signals 14a, 14b, 14c, 14d, 14e and 14f are output to the PWM inverter 2.

Figure 3:
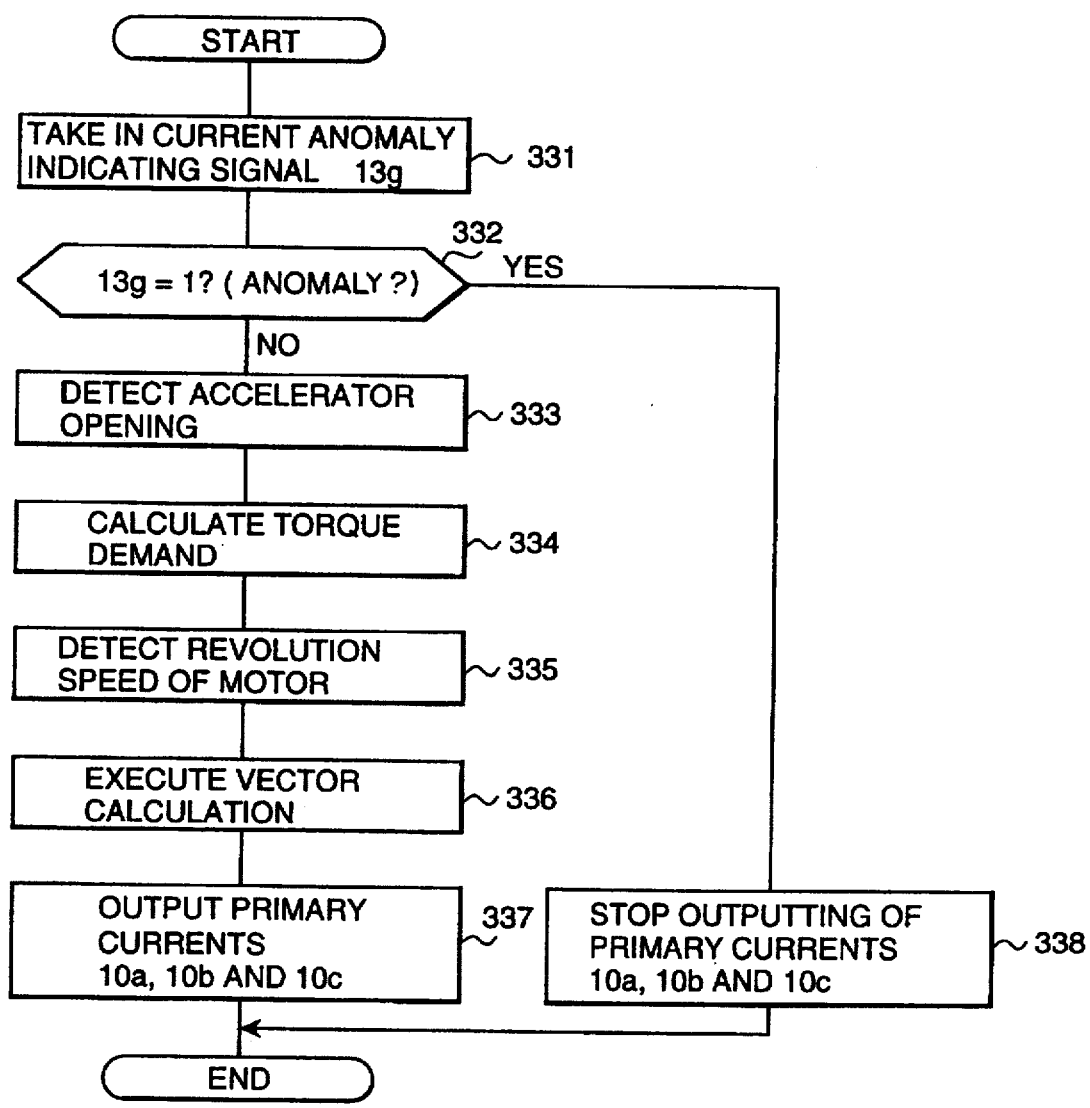
FIG. 3 is a flow chart of operations executed by a current demand generating part shown in FIG. 1.

FIG. 3 is a flow chart of operations executed by the current demand generating part 10 shown in FIG. 1.

The current demand generating part 10 firstly takes in the current anomaly indicating signal 13g output from the diagnostic microcomputer 31 at step 331. At step 332, the current sensor anomaly indicating signal 13g is checked, and an ordinary motor control is carried out if the signal 13g indicates "normal". That is, the opening of the accelerator is detected, and the torque demand is calculated. Then, the revolution speed of the motor is detected, and the current demands 10a, 10b and 10c based on results of a vector calculation for motor control are output. Steps 331–337 correspond to a process of outputting primary currents. On the other hand, if the signal 13g indicates "anomalous", the motor control is not carried out, and outputting of the primary currents 10a, 10b and 10b is stopped. A process composed of steps 331,332 and 338 to stop outputting the primary current is repeated at a constant period which is sufficiently shorter than the period for the process of outputting the primary currents.

In the following, operations of the diagnostic microcomputer 31 will be explained by referring to FIGS. 4–7.

Figure 4:
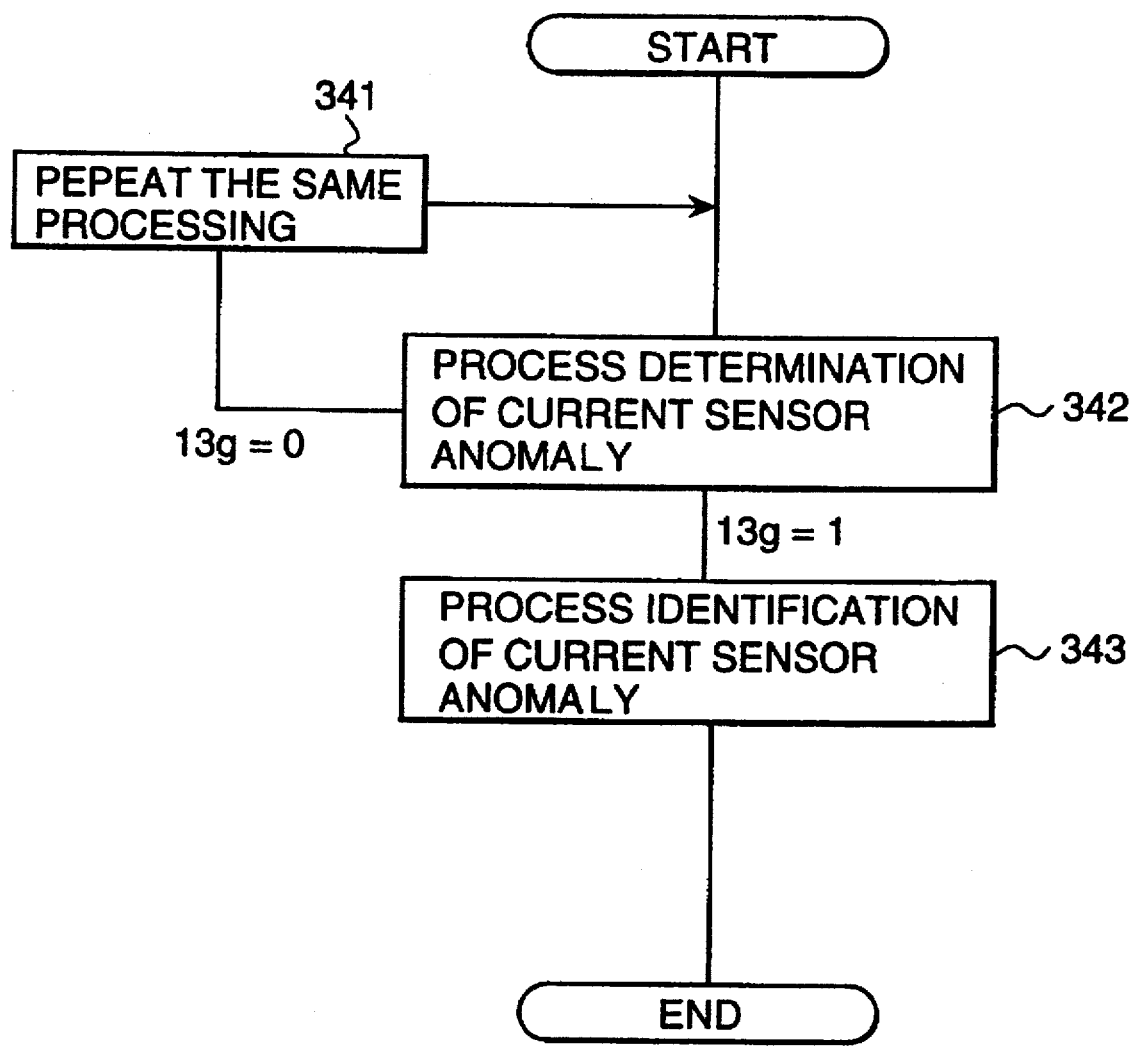
FIG. 4 is a fundamental flow chart of operations executed by a microcomputer for diagnosis shown in FIG. 1.

FIG. 4 is a fundamental flow chart of operations executed by the diagnostic microcomputer 31 shown in FIG. 1. At first, a process of detecting a current sensor anomaly is executed at steps 341–342. If no anomaly is detected in the detected currents, the signal 13g of "0" is output, and this process is repeated. On the other hand, if an anomaly is detected in the detected currents, the signal 13 g of "1" is output, and a process of identification of an anomalous sensor is executed at step 343. Details of these two processes will be explained later. A process composed of steps 341–343 is repeated at a constant period which is sufficiently shorter than the period for the process of outputting the primary currents, as is the process to stop outputting operations of the current demand generating part 10 and the abovementioned process of detecting an anomalous sensor. However, when the diagnostic microcomputer 31 takes over the motor control, the operations shown by the flow chart in FIG. 4 are not performed.

Figure 5:
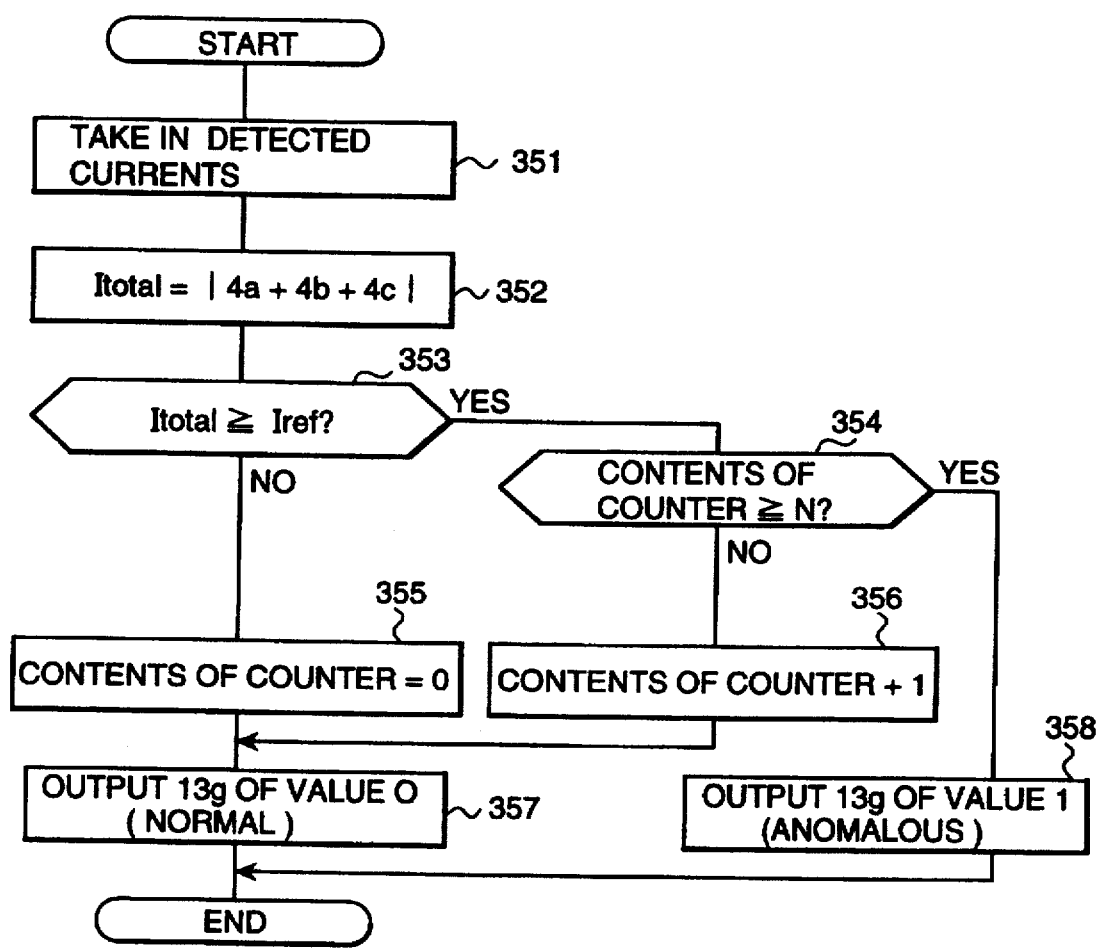
FIG. 5 is a flow chart of processing of current sensor anomaly determination shown in FIG. 4.

FIG. 5 is a flow chart of details of the process of detection of an anomalous current sensor in step 342 shown in FIG. 4.

As shown in FIG. 5, in the process of detecting the presence of an anomalous sensor, currents 4a, 4b and 4c detected by the three current sensors are firstly taken in at step 351. At step 352, a monitoring index is calculated, for example, by using an equation $I_{total}=|4a+4b+4c|$, based on the detected three currents, and at step 353, it is checked to see whether the calculated monitoring index $I_{total}$ satisfies a predetermined condition, for example, $I_{total} \geq I_{ref}$. In the existing conventional method of detecting an anomalous current sensor, $I_{ref}$ is set to zero. In the method of the present invention, new evaluating conditions are adopted so that the accuracy of anomaly detection is improved by avoiding erroneous detection of an anomaly caused by an instantaneous disturbance.

That is, in the method of the present invention, a counting process composed of steps 354,355 and 356 is provided. And, in the counting process, the number of successive times that the monitoring index $I_{total}$ exceeds the preset threshold value $I_{ref}$ are counted, and it is judged whether the counted times exceed the preset number N. If the number of successive times the monitoring index $I_{total}$ is greater than the preset threshold value $I_{ref}$ exceeds the preset number N, it is determined that an anomaly has occurred in the current sensors or the motor control unit, and the current sensor anomaly indicating signal 13g is set to "1" at step 358. And, if it is determined that an anomaly has not occurred in the current sensors or the motor control unit, the current sensor anomaly indicating signal 13g is set to "0" at step 357. Thus the current sensor anomaly detection means of the embodiment executes the process shown in the flow chart shown in FIG. 5.

Now, a supplementary explanation of the current sensor anomaly detection will be is mentioned in the following, by referring to FIGS. 8-11.

Figure 8:
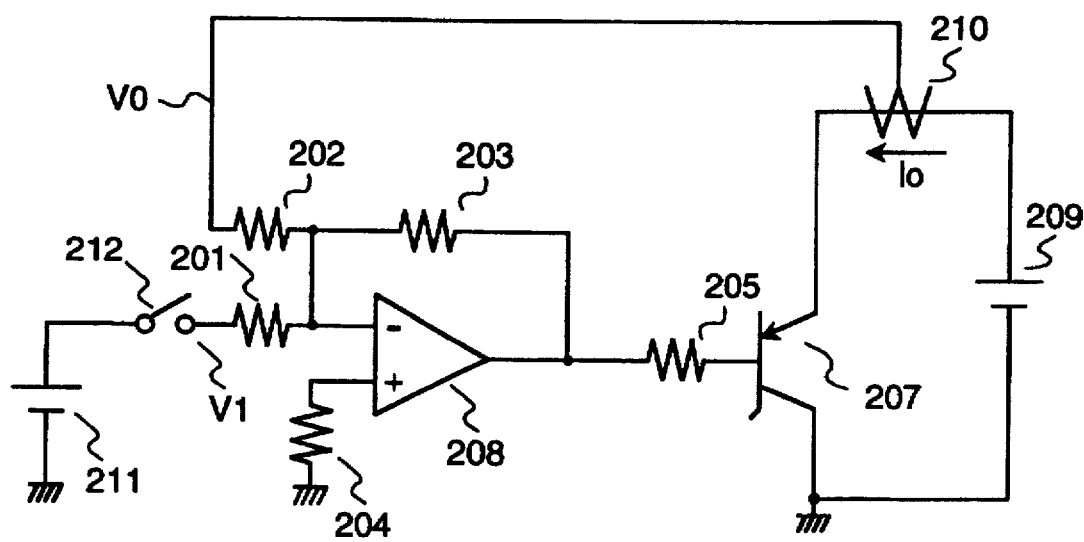
FIG. 8 is a schematic circuit diagram of a current control part.
Figure 9:
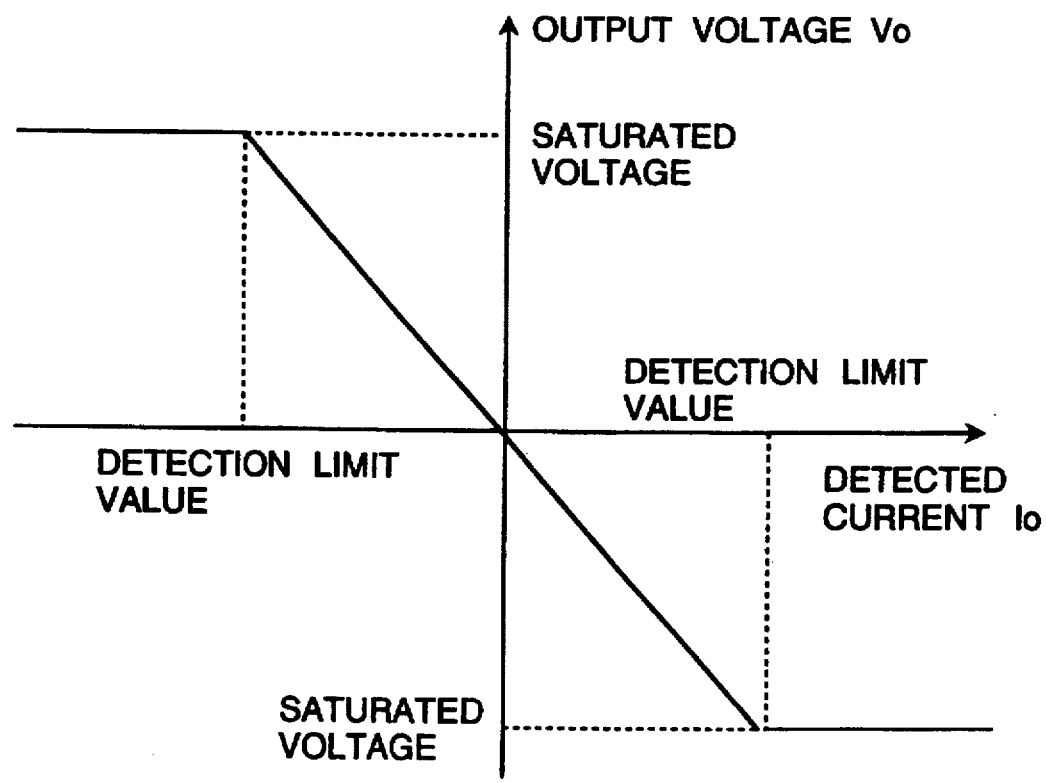
FIG. 9 is a diagram for explaining input/output characteristics of a current sensor.

FIG. 8 is a diagram for explaining certain principles concerning the operation of the current control part 11. The diagram shows a wellknown circuit, including an operational amplifier, used for a current control unit. And, FIG. 9 is a diagram for explaining the fundamental input/output characteristics of the current sensors 4, 5 and 6, showing the relation between the output voltage $V_O$ and the detected current $I_O$ of a current sensor 210. The current sensor has a detection limit, so that, as seen in FIG. 9, the output voltage becomes saturated if the detection current exceeds the detection limit.

Operations of the current control circuit shown in FIG. 8 will be explained hereafter. An operational amplifier 208 functions as an inverting adder, since the plus input terminal is connected to the ground via a resistor 204. That is, the value obtained by adding input voltages $V_1$ and $V_O$, is multiplied by a factor determined by resistors 201, 202 and 203 and further inverted and output by the amplifier 208.

When a switch 212 is closed and a positive voltage $V_1$ corresponding to the current demand signal is input to the operational amplifier 208, a transistor 207 is turned on, since the current $I_O$ is 0 at the beginning and the output of the operation amplifier 208 is a negative value. Consequently, as the absolute value of the current $I_O$ increases, the absolute value of the voltage $V_O$ also increases. Then, if the sum of $V_1$ and $V_O$ becomes negative, the output of the operational amplifier becomes positive and the transistor 207 is turned off. Thus, the current is controlled so that $V_O$ is equal to $V_1$.

Now, if an anomaly of the current control unit, such as a disconnection failure of the resistor 202, occurs, since the output $V_O$ is not input to the operational amplifier 208, the amplifier outputs the maximum negative value which it is able to, and the transistor 207 is constantly operated at the ON state. The value of $I_O$ increases, and exceeds a detection limit value and becomes saturated. Therefore, it happens that the output of the current sensor does not indicate a correct value even if the current sensor is normal, when an anomaly occurs in the current control unit.

In the following, a method for anomaly detection will be described.

Figure 10:
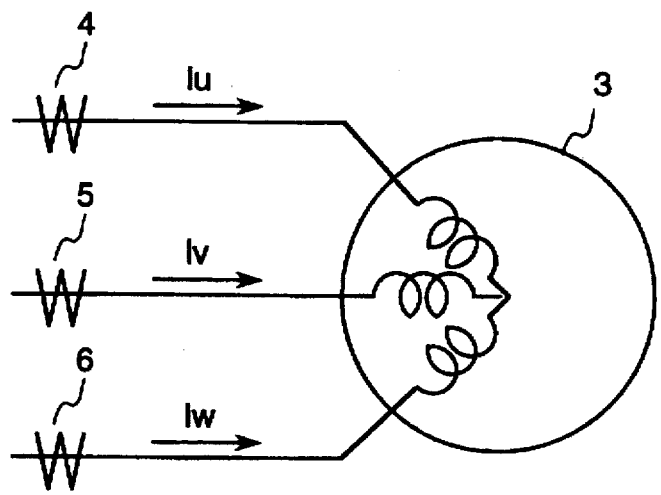
FIG. 10 is a diagram for explaining input/output characteristics of a three-phase AC motor.

FIG. 10 is a diagram for explaining an electrical circuit of a three-phase AC motor. The three currents flow in three-phases of the three-phase AC motor Iu, Iv and Iw, such that, $Iu+Iv+Iw=0$, from Kirchhoff's law. Each of the current sensors will detect a respective one of the currents Iu, Iv and Iw, and the sum of the three outputs of the current sensors is 0. Therefore, if any one of the current sensors becomes anomalous, the sum of the three outputs of the current sensors will not indicate a non-zero value. Such a non-zero sum of the outputs may be used for detecting occurrence of an anomaly in the current sensors. However, since this anomaly detection method assumes that the current control unit is normal, if the sum of the three outputs of the current sensors is not 0, this does not necessarily mean that a current sensor is anomalous. Thus this method can not correctly detect the occurrence of an anomaly in the current sensors, since if the current control unit becomes anomalous, such a large current may flow that the output of any current sensor will be saturated with the result that the sum of the three outputs of the current sensors will not be equal to zero. Further, even if there is an anomalous sensor, the anomalous sensor can not be identified.

Figure 11:
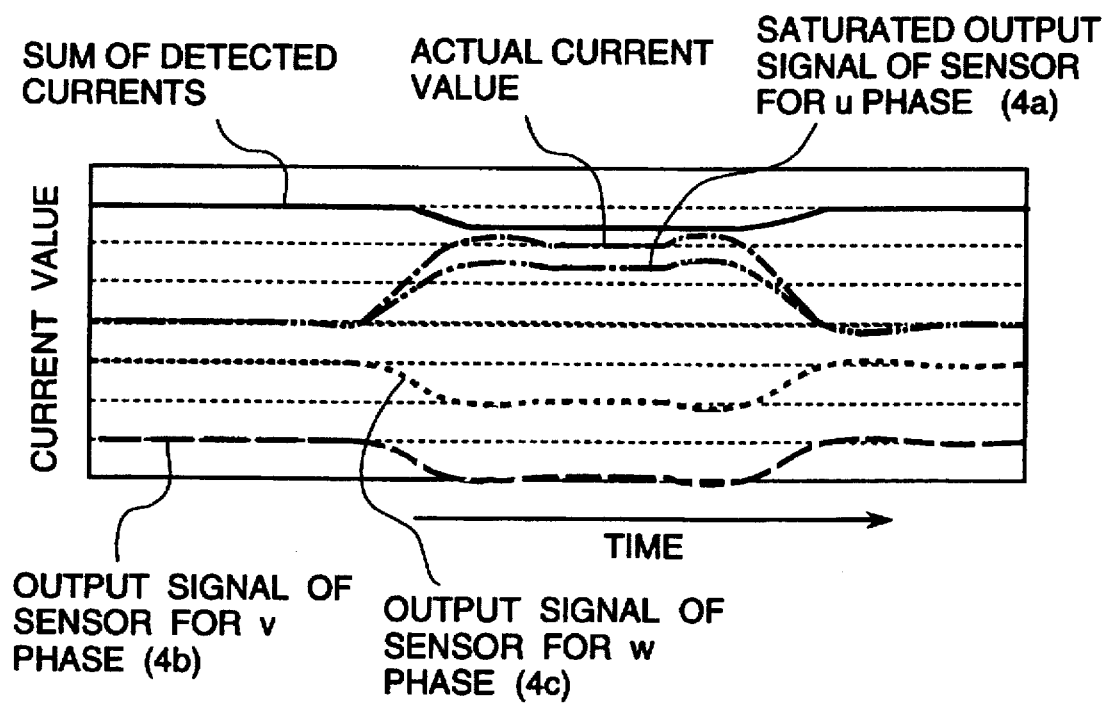
FIG. 11 is a waveform diagram for explaining operations of a current sensor anomaly detection part on anomalous operations of the current control unit.

FIG. 11 is a diagram for explaining operations of the current sensor anomaly detecting part 30 concerning anomalous operations of the current control unit. The diagram shows waveforms of the outputs of the current sensors 4, 5 and 6 and the sum of the three outputs when one current for a phase in the three-phase currents output from the current control unit has the appearance of being anomalous in the three-phase currents being fed to the motor. It is seen that the sum of the detected currents is not 0 since the output of the current sensor for detecting the anomalous current exceeds the detection limit and is saturated. As mentioned above, if the current control unit is anomalous, an anomaly occurring in the current sensors can not be correctly detected.

Next, processing for identification of an anomalous current sensor in accordance with the present invention will be explained with reference to FIG. 6.

Figure 6:
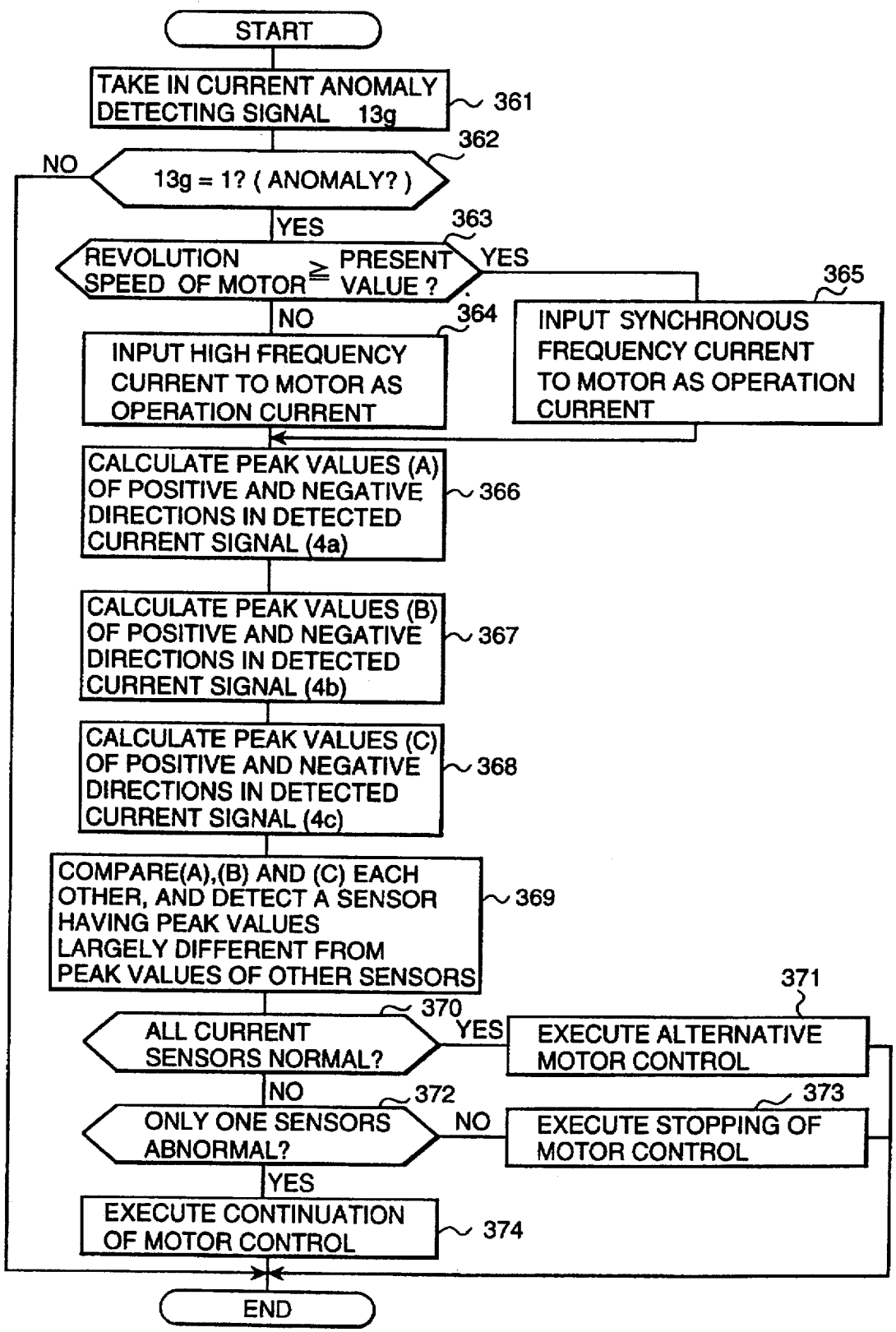
FIG. 6 is a flow chart of processing of anomalous sensor identification.

FIG. 6 is a flow chart indicating details of the processing of the anomalous sensor identification step 343 shown in FIG. 4.

In the processing of the anomalous sensor identification, an anomalous sensor is identified when an anomaly is detected in the current sensors. At first, a current anomaly detecting signal 13g is taken in at step 361, and the value of the signal 13g is checked at step 362. Then, if it is judged that an anomaly is occurring in the current sensors at step 362, the signal 13g having a value of 1 is transmitted to the switching unit 14, and the currents fed to the motor are switched to the diagnostic PWM signals by the switching unit 14, and then the diagnostic currents are fed to the motor 3 from the PWM inverter 2.

Now, at steps 362-365, the anomaly diagnosis part 13 generates PWM signals so that the motor is controlled at an operation frequency sufficiently higher than a synchronous frequency, if the revolution speed of the motor is less than a preset value, or the motor is controlled at the same operation frequency as the synchronous frequency, if the revolution speed of the motor is equal to or greater than a preset value. The reason why the operation frequency is changed depending on the revolution speed of the motor is, that alternating currents do not flow in the motor and an anomaly detection in the current sensors will not be correctly performed if the motor is operated by direct currents, since the synchronous frequency is 0 when a current sensor fails during the vehicle stopping state resulting from a driver's releasing the accelerator. That is, if a current sensor fails and has a constant off-set output value, an anomaly may not be correctly determined.

Thus, if the revolution speed of the motor is less than the preset value at a certain state, such as occurs when the vehicle is stopping, an anomalous current sensor can be identified by generating an alternating current of a sufficiently high frequency. In this condition of operation, the generation of an unnecessary torque can be suppressed to the utmost, since the slip value becomes very large by largely shifting the operation frequency from the synchronous frequency. And, if the motor is operated at the synchronous frequency when an anomaly occurs in the current sensors, during the running operation of a vehicle, the slip is zero, which does not generate an unnecessary torque. Further, the relation between the slip and the generated torque is explained in the following.

Figure 12:
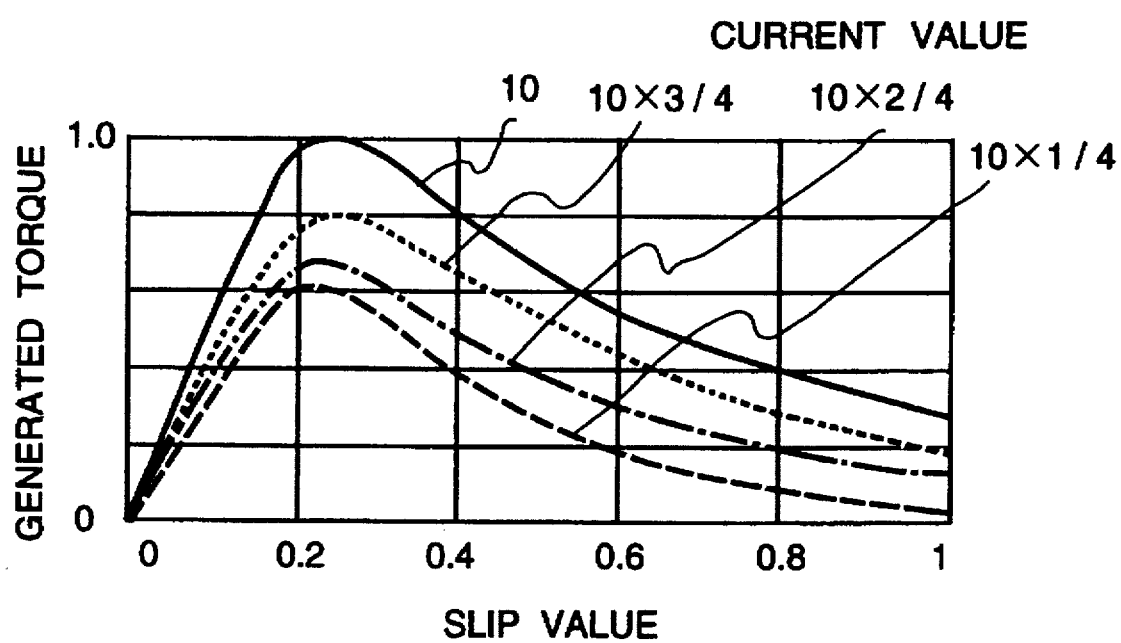
FIG. 12 is a characteristic diagram for explaining a relation between slip value and generated torque.

FIG. 12 is a diagram for explaining the relation between the slip value and the generated torque. That is, the diagram shows the relation between the slip value and the generated torque in the case of operation at the synchronous frequency $f_O$ of the PWM inverter. A slip value of 0 means that the operation frequency is equal to the synchronous frequency, and the motor is operated synchronously with the operation frequency. And, a slip value of i means that the revolution speed of the motor is 0. The generated torque changes corresponding to the exciting currents, that is, the current demand $I_o$, decreasing as the exciting currents become smaller. The torque generation is controlled at a slip value less than ¼ which is the maximum value in usual operations of the motor. And, it is known that the generated torque is generally about 30% of the maximum torque, at the point of the slip value of 1. Thus, if the operation frequency of the PWM inverter is synchronized with the revolution speed of the motor, the generated torque is 0. Further, even if the exciting current is decreased to less than about ¼ of the rated value, and the slip value is also decreased to less than about 1¼, in other words, the operation frequency of the PWM inverter is held at a frequency four times higher than the revolution speed of the motor, the generated torque is sufficiently small.

Therefore, in the embodiment, if the revolution speed is less than the preset value, the diagnostic PWM signal is generated and output so that diagnostic currents of having a frequency at least four times higher than the synchronous frequency of the motor is fed to the motor.

As mentioned above, at steps 363–365, the diagnostic currents are fed to the motor by the anomaly diagnosis part 13, and each of the current sensors detects an alternating current if the current sensors are normal. Therefore, it is possible to identify an anomalous current sensor from the three current sensors by collating each of the fed diagnostic currents, that is, current waveforms, 4a', 4b' and 4c' detected by the current sensors with respective of reference currents, that is, reference current waveforms.

More particularly, the following method is available to identify an anomalous current sensor. This method determines an anomalous current sensor by preparing a corresponding matrix representing the correspondence between the reference current values to be detected and the fed diagnostic current, and collating the detected diagnostic current values with the reference current valves. On the other hand, the following method is also available. In this method, the detected peak values in the plus and minus directions of the current waveforms corresponding to the fed diagnostic currents 4a', 4b' and 4c' are stored as pairs of monitoring values. Then, the pairs of monitoring values are collated with each other, and a current sensor having a pair of monitoring values largely different from other pairs of monitoring values is identified as an anomalous current sensor.

In the processing shown by the flow chart in FIG. 6, the later method is adopted and executed at steps 366–369.

Figure 13:
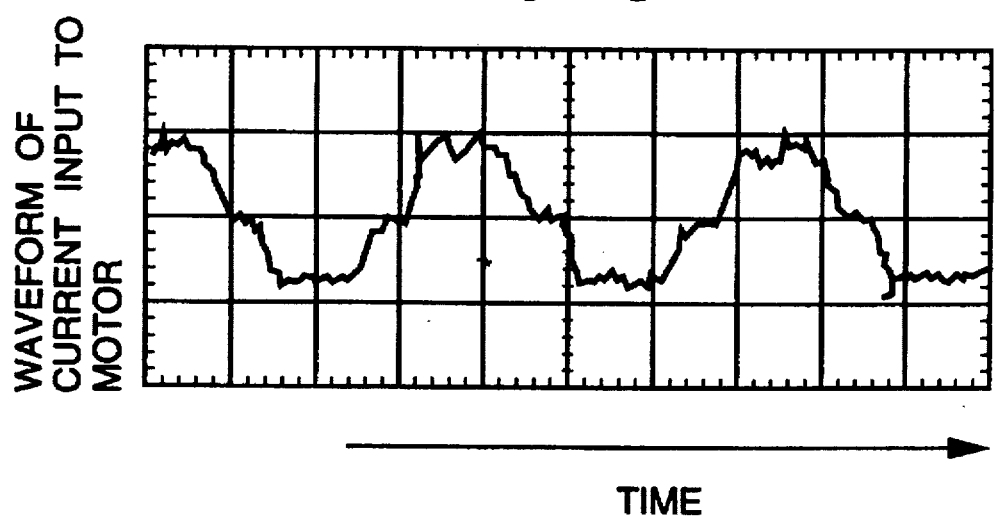
FIG. 13 is a waveform diagram of a diagnostic current fed to the three-phase AC motor for the sensor diagnosis.

FIG. 13 is an example of a waveform of a diagnostic current fed to the three-phase AC motor for purposes of the sensor diagnosis.

A graph in the figure shows a current waveform of one of the three diagnostic currents fed from the anomaly diagnosis part 13 to the motor 3. And, the current waveform is used as the reference waveform of the currents flowing in the motor 3, which is output from the PWM inverter 2 by switching the PWM signals fed to the PWM inverter 2 from the usual PWM signals to the diagnostic PWM signals using the switching unit 14. Thus, if the current sensors 4, 5 and 6 are normal, each of the current waveforms detected by the current sensors almost conforms to the above-mentioned reference waveform. That is, if the current sensors 4, 5 and 6 are normal, each of the detected diagnostic currents has peaks in the plus and minus directions with almost the same value.

After an anomaly in the detected currents is identified, at steps 370–374, the motor is controlled corresponding to the identified anomaly. That is, operations of the electric vehicle are processed by executing a control mode of the motor, corresponding to the normal state of the current sensor or the anomalous state of the current sensor. Although the processing of the steps 370–374 is carried out by the anomaly diagnosis part 13 in the embodiment, it is possible to carry out the processing in another part or a separately provided unit.

At step 370, it is determined whether all the current sensors are normal from the results of the anomaly diagnosis for the detected currents. If all the current sensors are normal, it is determined that the current control unit is anomalous. Then, the anomaly diagnosis part 13 having a function of a supplementary motor control takes over the control of the motor in the place of the motor control unit 1. That is, an alternative motor control processing is executed by making the diagnostic microcomputer 31 take over the microcomputer used as the motor control unit 1. Generally, since the information processing capacity of the diagnostic microcomputer 31 is small, allowing a microcomputer for a backup use to be used, it is preferable to use the diagnostic microcomputer 31 as an alternative motor control unit in an emergency operation, such as a turnout operation. Naturally, it is available for use as a backup microcomputer having the same capacity as the microcomputer used as the motor control unit 1, for taking over for the motor control unit 1.

At step 372, it is determined whether only one current sensor in anomalous. If two or more current sensors are anomalous, stopping of the motor control is carried out at step 373. On the other hand, if only one current sensor is anomalous, continuing the motor control is processed at step 374.

Figure 7:
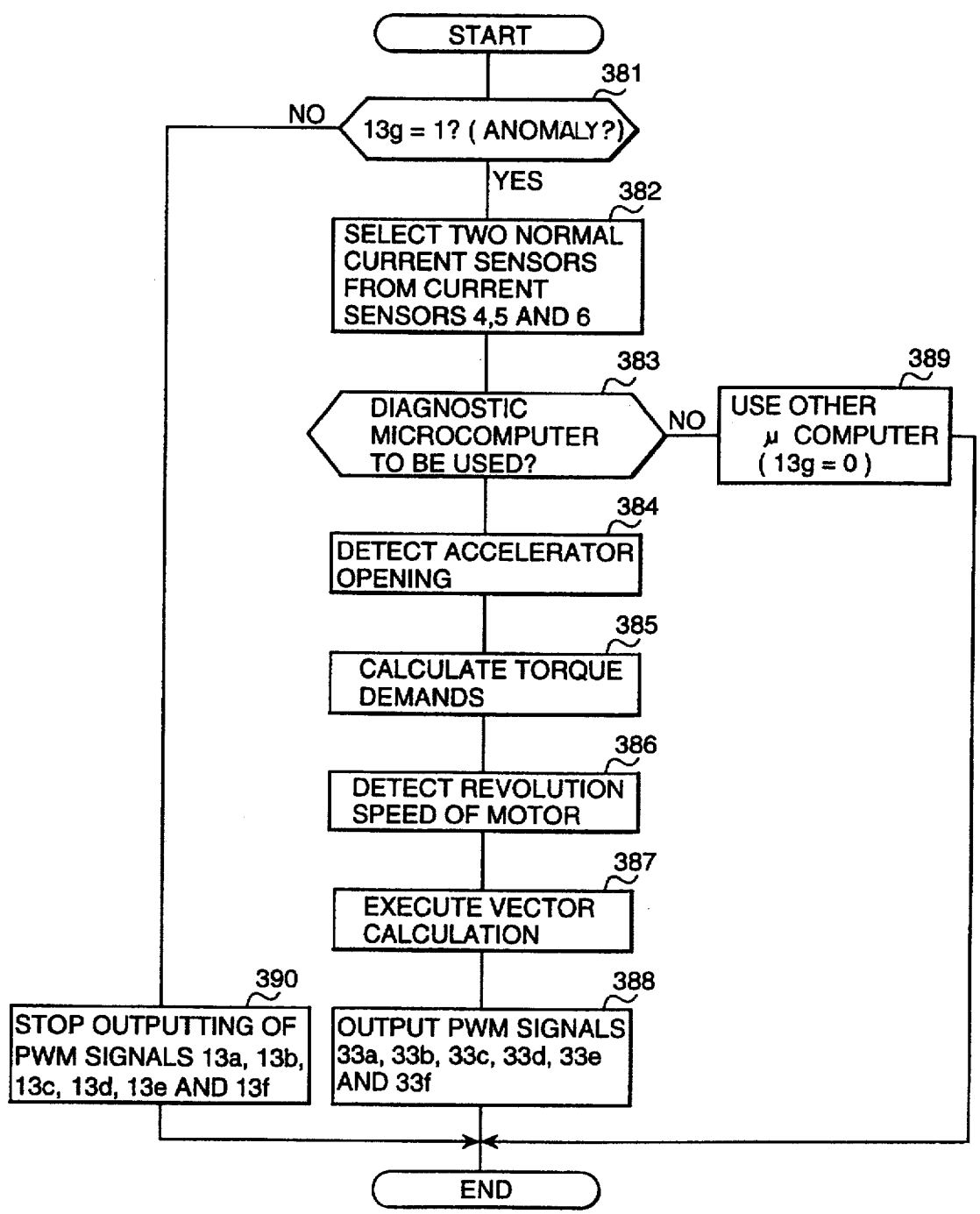
FIG. 7 is a flow chart of processing of motor control continuation shown in FIG. 6.

FIG. 7 shows a flow chart of the processing of the continuation of the motor control shown by the steps 372 and 374 in FIG. 6.

In processing the continuation of the motor control, a vector control for the motor is executed by using two current sensors determined as normal by the above-mentioned anomaly detection processing, for the control feedback of the currents detected by the remaining two sensors.

At steps 381 and 382, two normal current sensors are identified. Then, at step 383, the diagnostic microcomputer 31 including the anomaly diagnosis part 13 having a function of a supplementary motor control, or another microcomputer, such as the microcomputer used as the motor control unit 1, is selected for continuing the motor control. If the diagnostic microcomputer 31 is selected for controlling the motor, the diagnostic microcomputer 31 executes feedback control of the motor by using "the remaining two normal current sensors". In this operation mode, the diagnostic microcomputer 31 outputs PWM signals 33a–33f for the motor control. The two normal current sensors should be correctly identified so that the feedback control of the motor by using "the remaining two normal current sensors" is correctly executed. Further, an equation used for the motor control is different from the equation usually used for the motor control.

On the other hand, if another microcomputer, such as the microcomputer used as the motor control unit 1, is selected, the current anomaly indicating signal 13g of the value 1 is output at step 389, and the current control unit 11 executes the feedback control of the motor by using "the remaining two normal current sensors". The steps 383 and 389 can be omitted.

By processing the alternative motor control or the continuation of the motor control as mentioned above, the slow-movement to a service station or a turnout operation becomes possible. On the other hand, in the existing method, the control of a motor, that is, the operation of an electric vehicle, becomes impossible if an anomaly occurs in a current control circuit or current sensors. Therefore, by using the present invention, an electric vehicle of high operational reliability can be offered.

By using the present invention, an effective alternative motor control can be carried out if the current control unit becomes anomalous, since it can be determined whether a detected current anomaly is caused by an anomaly occurring in the current control unit or an anomaly occurring in one of the current sensors. Further, since an anomalous current sensor can be identified, the motor control can be continued by using the remaining two normal current sensors. Therefore, even if an anomaly occurs in the current control unit or the current sensors, operations of an electric vehicle can be continued, especially the turnout operation of an electric vehicle become possible in an emergency, by using the present invention, which improves the operational reliability of an electric vehicle.

What is claimed is:

1. A control apparatus for an electric vehicle having a three-phase AC motor for driving said vehicle, three current sensors, each of said current sensors detecting a current of a respective phase in said three-phase AC motor, and a revolution speed detector for detecting the speed of the three-phase AC motor, said control apparatus comprising:

a motor control unit for controlling the three-phase AC motor, which the motor control unit includes a current demand generating unit for generating current demands based on a revolution speed detected by said revolution speed detector, a current control unit for performing a feedback control based on said current demands and currents detected by said current sensors, and a PWM signal generating unit for generating PWM signals;

an inverter responsive to said PWM signals for feeding currents to said three-phase AC motor;

anomaly detection means for detecting an anomaly in the currents detected by said current sensors by checking whether a monitoring index, obtained by processing three values of said detected currents, exceeds a preset threshold level, and outputting a current anomaly indicating signal, if an anomaly is detected; and anomaly diagnosis means for inputting diagnostic currents to said three-phase AC motor via said inverter in said response to said current anomaly indicating signal and identifying an anomalous current sensor out of said three current sensors, based on detection results of said diagnostic currents detected from said three current sensors, wherein a motor control corresponding to one of a presence and a non-presence of an anomaly in said detected three current sensors is executed.

2. A control apparatus for an electric vehicle according to claim 1, wherein said anomaly diagnosis means comprises diagnostic signal outputting means for outputting diagnostic PWM signals to generate and feed said diagnostic currents to said inverter, signal switching means responsive to said current anomaly indicating signal for switching signals to be sent to said inverter from said PWM signals generated by said PWM generating unit to said diagnostic PWM signals, and anomalous sensor identifying means for identifying an anomalous current sensor of said three current sensors by comparing each of three diagnostic currents detected by said current sensors with a set of normal reference current data.

3. A control apparatus for an electric vehicle according to claim 2, wherein said diagnostic signal outputting means in responsive to a detected revolution speed of said three-phase AC motor for judging whether said detected revolution speed is not less than a preset revolution speed, and, if said detected revolution speed is not less than said preset revolution speed, outputs said diagnostic PWM signals so that said diagnostic currents have a frequency synchronous with said revolution speed.

4. A control apparatus for an electric vehicle according to claim 2, wherein said diagnostic signal outputting means in responsive to a detected revolution speed of said three-phase AC motor for judging whether said detected revolution speed is less than a preset revolution speed, and, if said detected revolution speed is less than said preset revolution speed, outputs said diagnostic PWM signals so that said diagnostic currents have a frequency at least four times higher than a frequency synchronous with said revolution speed.

5. A control apparatus for an electric vehicle according to claim 2, wherein said diagnostic signal outputting means has supplementary motor control means which has a control function equivalent to said motor control unit, and said anomalous sensor identifying means has motor control continuing means for causing said supplementary motor control means to continue control of said three-phase AC motor by using two normal current sensors other than an anomalous current sensor identified by said anomalous sensor identifying means, if one of said three current sensors is judged as anomalous by said anomalous sensor identifying means.

6. A control apparatus for an electric vehicle according to claim 2, wherein said diagnostic signal outputting means has supplementary motor control means which has a control function equivalent to said motor control unit, and said anomalous sensor identifying means has alternative motor control means for causing said supplementary motor control means to take over said motor control unit, if an anomaly is detected by said anomaly detection means, and all of said three current sensors are judged as normal by said anomalous sensor identifying means.

7. A control apparatus for an electric vehicle according to claim 2, wherein said set of normal reference current data are a pair of peak values in a plus direction and a minus direction of a waveform for said diagnostic currents to be detected.

* * * * *